(12) United States Patent
Pribat et al.

(10) Patent No.: US 8,008,109 B2
(45) Date of Patent: Aug. 30, 2011

(54) FLAT DISPLAY ACTIVE PLATE

(75) Inventors: Didier Pribat, Sevres (FR); Costel Sorin Cojocaru, Palaiseau (FR)

(73) Assignees: Centre National de la Recherche Scientifique (FR); Ecole Polytechnique (FR)

( * ) Notice: Subject to any disclaimer, the term of this patent is extended or adjusted under 35 U.S.C. 154(b) by 447 days.

(21) Appl. No.: 11/921,982

(22) PCT Filed: Jun. 29, 2006

(86) PCT No.: PCT/FR2006/050650
§ 371 (c)(1),
(2), (4) Date: Nov. 7, 2008

(87) PCT Pub. No.: WO2007/003852
PCT Pub. Date: Jan. 11, 2007

(65) Prior Publication Data
US 2010/0203686 A1  Aug. 12, 2010

(30) Foreign Application Priority Data
Jun. 30, 2005  (FR) ..................................... 05 51839

(51) Int. Cl.
*H01L 21/00* (2006.01)
*H01L 29/08* (2006.01)
(52) U.S. Cl. ....... 438/82; 438/99; 257/40; 257/E33.001; 257/E25.008; 257/E51.018; 313/504; 428/690
(58) Field of Classification Search .................. 438/82, 438/99; 257/40, E33.001, E25.008, E51.018, 257/E51.001; 313/504, 506; 428/690, 917
See application file for complete search history.

(56) References Cited

U.S. PATENT DOCUMENTS

2004/0017520 A1  1/2004  Yoo et al. .......................... 349/43
2006/0292870 A1*  12/2006  Pribat ............................ 438/680

FOREIGN PATENT DOCUMENTS

FR  2 860 780  4/2005

OTHER PUBLICATIONS

Lew et al. "Growth Characteristics Of Silicon Mamowires Synthesized By Vapor-Liquid-Solid Growt IN Nanoporous Alumina Templates", Journal of Crystal Growth 254 (2003) pp. 14-22.
Pribat et al. "Lateral Alumina Templates for Carbon Nanotubes and Semiconductor Nanowire Synthesis", Quantum Sensing and Nanophotonic Devices, II, vol. 5732, Mar. 2005.
Redwing et al. "Synthesis and Properties of Si and SiGe/Si Nanowires", Proceddings of SPIE, Quantum Dots, Nanoparaticles and Nanoclusters, vol. 5361, 52 (2004).
International Search Report dated Mar. 14, 2007.

* cited by examiner

*Primary Examiner* — Hsien-ming Lee
(74) *Attorney, Agent, or Firm* — Howard IP Law Group, PC (57) ABSTRACT

A method for manufacturing the active plate of a flat matrix display screen, in which each cell comprises an electrode plate connected by a transistor to a first conductive line, comprising the steps of providing an outgrowth coated with an insulator of each first conductive line at the level of each cell; etching or making porous an end portion of each outgrowth; laterally growing, for example, by a VLS method, a PIP or NIN semiconductor structure in each end portion which has been etched or made porous; and establishing a contact at the free end of the semiconductor structure and forming a gate at the level of the median portion of the semiconductor structure.

10 Claims, 5 Drawing Sheets

FLAT DISPLAY ACTIVE PLATE

This application claims the benefit of Int'l Application No. PCT/FR2006/050650, filed Jun. 29, 2006 and French Application No. 05/51839, filed Jun. 30, 2005, the entire disclosures of which are incorporated herein by reference.

FIELD OF THE INVENTION

The present invention relates to the manufacturing of flat display screens. It also relates to a transistor structure particularly adapted to the manufacturing of such display screens.

The present invention especially applies to matrix displays such as liquid crystal displays (LCD) and displays with organic light-emitting diodes currently designated as OLEDs. Such flat display screens require forming of a so-called active plate supporting a pixel matrix comprising transistors on an insulating plate of large surface area. Generally, LCDs comprise one transistor per cell and OLED displays at least comprise two transistors per cell.

DISCUSSION OF PRIOR ART

The lower plate or active plate of a flat matrix display such as an LCD is generally formed from a plate made of glass or another insulating material, preferably transparent, of very large dimensions. In current manufacturing techniques, glass plates having one or both sides of dimensions greater than one meter are used, either to form very large display screens or to form displays of desired dimensions by cutting of the plates after manufacturing. Each lower plate is placed opposite to an upper plate from which it is separated by spacers. The space between the lower and upper plates is filled with a liquid crystal with optical properties depending on the biasing of each pixel in the display screen.

Figure 1:
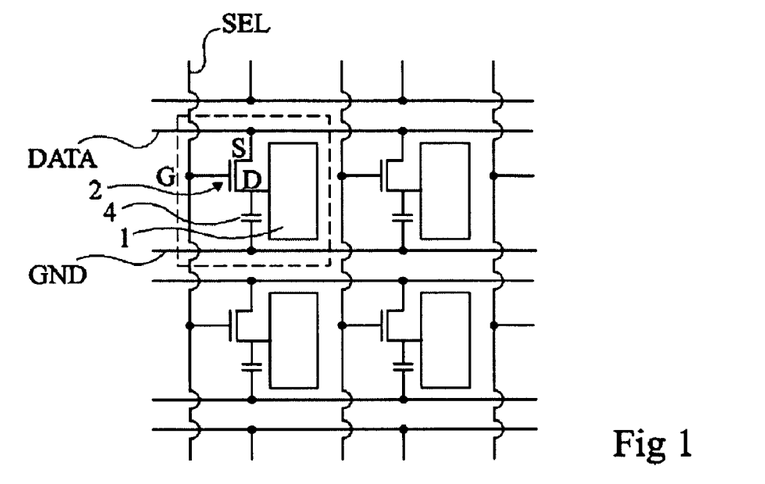
FIG. 1 partially shows in the form of a circuit the outlook of a cell of the active plate of a flat matrix display screen such as an LCD.

FIG. 1 partially shows in circuit form the outlook of an assembly of four pixels of the active plate of an LCD-type display. Each pixel comprises an electrode plate 1 which may be set to a high or low voltage by its connection to a data line (DATA) formed via a switch 2, currently a MOS transistor, having its gate connected to a selection line (SEL). Electrode plate 1 is intended to form a first armature of a capacitor having its other armature formed on the other plate (upper plate) of the display. In the example of FIG. 1, data lines DATA correspond to rows and selection lines SEL correspond to columns. The gate, source, and drain terminals of MOS transistor 2 have been designated as G, S, and D, it being understood that designations source and drain may be interchanged. In the example of FIG. 1, the drain terminal is also connected to a capacitance 4 having its second terminal connected to a fixed voltage, for example, a ground line GND.

One of the difficulties in the forming of the active plate of an LCD lies in the forming of switch 2. As indicated, this switch is generally made in the form of a MOS transistor. However, given the costs that this would imply, placing a transistor chip at the level of each cell is out of the question.

It has thus been tried to manufacture transistors based on semiconductor layers directly deposited on the base glass plate or on an intermediary layer deposited on this plate.

The two main techniques developed up to now to form such thin film transistors (TFT) are based on hydrogenated amorphous silicon depositions and on polysilicon depositions.

Transistors formed from a hydrogenated amorphous silicon deposition are the simplest to form and enable limiting the number of masking steps implied in the forming of the active plate. They however have many disadvantages linked to the low mobility of the carriers, which limits their rapidity and their capacity to carry current. Further, hydrogenated amorphous silicon is a metastable material which exhibits significant drifts as to the threshold voltage of the transistors when said transistors are urged with a high duty cycle.

It has been attempted to form transistors from polysilicon obtained by crystallization of an amorphous precursor. However, this technology is not very developed yet and is very difficult to form and provides imperfect performances especially as compared with transistors formed on a single-crystal substrate.

SUMMARY OF THE INVENTION

An object of the present invention is to form an active flat display screen plate in which each cell comprises at least one electrode plate and one transistor, the various cells being associated in a matrix.

Another object of the present invention is to form such a structure in which the transistors provide good electric characteristics.

Another object of the present invention is to provide such a plate that can be manufactured in a decreased number of steps, and especially of masking steps.

A more general object of the present invention is to provide a field-effect transistor which can be formed on an insulating layer.

To achieve these objects, the present invention provides a method for manufacturing the active plate of a flat matrix display screen, in which each cell comprises an electrode plate connected by a transistor to a first conductive line, comprising the steps of:

providing an outgrowth coated with insulator of each first conductive line at the level of each cell;

etching or making porous an end portion of each outgrowth;

laterally growing, for example, by a VLS method, a PIP or NIN semiconductor structure in each end portion which has been etched or made porous; and establishing a contact at the free end of the semiconductor structure and forming a gate at the level of the median portion of the semiconductor structure.

According to an embodiment of the present invention, the metal of the first conductive lines is aluminum which is made porous by anodic oxidation at the level of said outgrowths.

According to an embodiment of the present invention, the metal of the first conductive lines is nickel, molybdenum, or copper which is partially eliminated under the insulated portion.

According to an embodiment of the present invention, the method comprises the steps of:

depositing and etching on a glass plate a first conductive layer to define the first conductive lines comprising outgrowths at the level of each cell;

coating the structure with a layer of an insulating material;

opening the end of the outgrowths and forming transistors therein;

depositing and etching a second conductive layer to form the electrode plates; and depositing and etching a third conductive layer to define second conductive lines, the second lines comprising portions covering the channel areas of the transistors, and to define a conductive region connecting a main terminal of a transistor to an electrode plate.

According to an embodiment of the present invention, in the electrode plate definition step, the maintaining of conductive regions above portions where the second lines cross other lines or metallizations of the structure is further provided.

According to an embodiment of the present invention, the method comprises the steps of:

defining in a first conductive layer first lines comprising outgrowths at the level of each cell, and portions of second lines at the locations where they do not cross first lines;

disengaging the end of the first outgrowths and the upper surface from said portions;

forming transistors in the outgrowths;

depositing a second conductive layer, this second layer being etched to form:
  the electrode plate of each cell,
  a gate region in contact with said portions, and
  regions interconnecting the portions to ensure the continuity of the second lines.

According to an embodiment of the present invention, a portion of the electrode plate extends above a portion of a third conductive line, the conductive line being an aluminum line and a dielectric such as alumina being interposed between the electrode plate portion and the conductive line.

According to an embodiment of the present invention, two transistors per cell are simultaneously formed from outgrowths coated with insulator of various conductive lines of each cell.

The foregoing objects, features, and advantages of the present invention, as well as others, will be discussed in detail in the following non-limiting description of specific embodiments in connection with the accompanying drawings.

BRIEF DESCRIPTION OF THE DRAWINGS

For clarity, the same elements have been designated with the same reference numerals in the different drawings. Further, as usual in the representation of integrated circuits, the various drawings are not to scale.

DETAILED DESCRIPTION

First Embodiment of an Active LCD Plate Cell

Figure 2A:
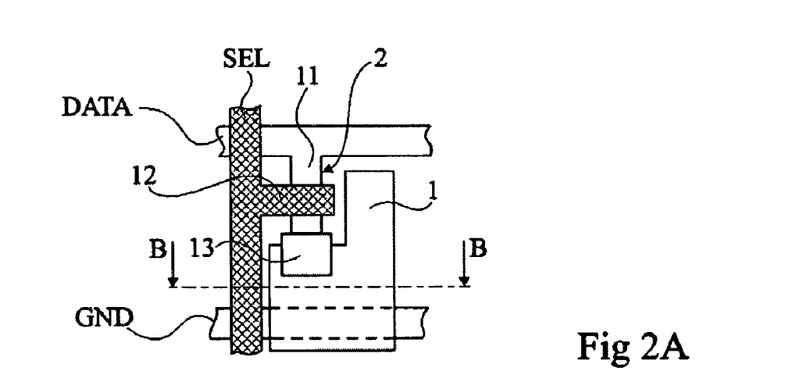
FIG. 2A is a top view of a active plate portion of an LCD-type flat display screen cell according to an embodiment of the present invention.

FIG. 2A shows an embodiment of a cell of an active plate of an LCD-type flat display screen according to the present invention. This cell is formed at the crossing of a data row DATA and of a selection column SEL, both formed of conductive strips. The electrode plate is made in the form of a electrode plate 1, for example, made of a transparent conductive material such as ITO (indium and tin oxide). Transistor 2 is formed in an outgrowth 11 of data line DATA in a way which will be described in further detail hereafter. Gate G of transistor 2 is formed of a portion 12 of selection line SEL extending above the median portion of outgrowth 11. A conductive pad 13 connects the end (drain or source) of transistor 2 to conductive electrode plate 1. Capacitor 4 (which is preferred, though optional) is formed of the superposition of a portion of electrode plate 1 and of a conductive line of fixed voltage, for example, ground GND, extending along the row direction.

Figure 2B:
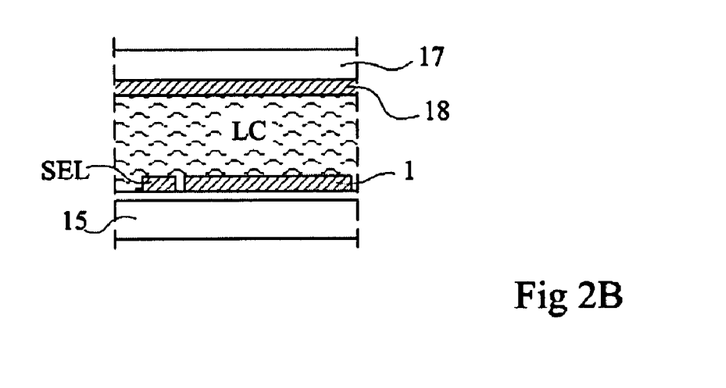
FIG. 2B is a simplified cross-section view of a portion of an LCD-type flat display screen comprising an active plate according to the present invention.

FIG. 2B is a cross-section view along plane BB of FIG. 2A in which a portion of the support plate, for example, a glass plate 15, can be seen on the lower side. On plate 15, a section of conductive line SEL and a section of electrode plate 1 are visible. Above plate 15 is arranged an upper plate 17 having its internal wall at least partially coated with an upper electrode conductive layer 18. Between plates 15 and 17 is inserted a liquid crystal LC.

In the present description, the spacers and the other means of mutual positioning of the upper and lower plates will not be described, nor will the steps of forming of color filters above the individual pixels. Indeed, such means and steps are well known and the present description is focused on the forming on the lower plate or active plate.

FIGS. 3A to 3D are top views illustrating successive steps of the manufacturing of an active plate cell of a flat display screen according to an embodiment of the present invention. It should be understood that the described structures are formed on a support plate, for example, a glass plate 15 such as shown in FIG. 2B. It should be noted that the sequence of steps of FIGS. 3A to 3D only requires four masking steps, each of these drawings corresponding to a masking step.

Figure 3A:
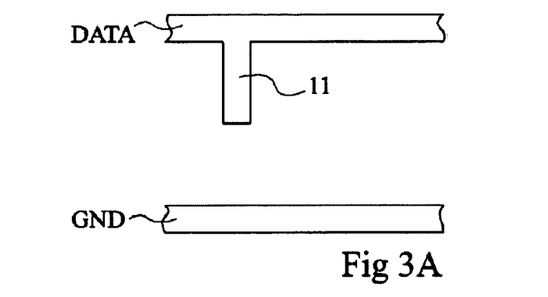
FIGS. 3A to 3D are top views illustrating successive steps of the manufacturing of a flat display screen cell according to a first embodiment of the present invention.

At the step illustrated in FIG. 3A, a first conductive layer, preferably an aluminum layer, for example having a thickness on the order of from 100 to 500 nm, is deposited and etched, and tracks for example having a width on the order of from 2 to a few tens of µm according to the screen size are etched. Track GND and track DATA with its outgrowth 11 towards the cell to be formed are thus formed. Then, the entire structure is coated with an insulating layer 19 (see FIG. 4A) especially having an encapsulation function.

FIG. 3A is not drawn to scale. In an embodiment, the step of the cells in the vertical direction will be on the order of 100 µm and the step of the cells in the horizontal direction will be on the order of 300 µm.

Figure 3B:
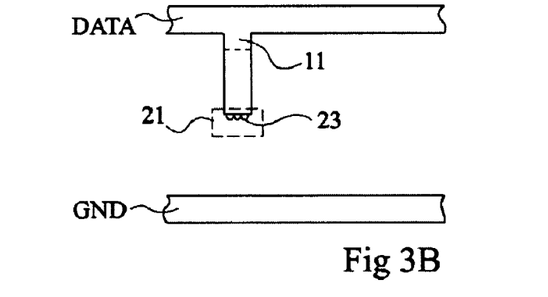

At the step illustrated in FIG. 3B, an area corresponding to the end of outgrowth 11 of the track of aluminum or another metal is opened in insulating layer 19, by means of a mask having its contour designated by dotted line 21. Then, by a process having two improved embodiments according to the present invention described hereafter in relation with FIGS. 4A-4D and 5A-5D, a transistor is formed in outgrowth 11. According to this process, the metal track is hollowed and a semiconductor structure forming a lateral transistor having its bottom in contact with conductive track DATA and having its front end 23 appearing at the end of the outgrowth is grown in the hollowed area by a so-called VLS (vapor-liquid-solid) method.

Figure 3C:
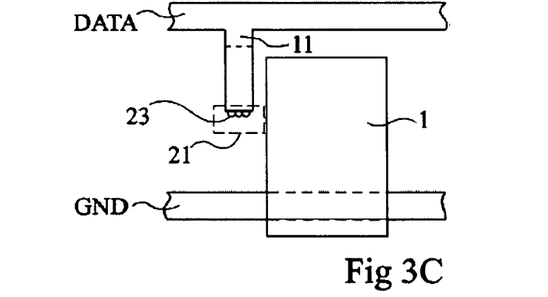

At the next step, illustrated in FIG. 3C, a second conductive layer is deposited and etched to leave in place an electrode plate 1 pattern. In the preferred embodiment, in which a track GND is provided, this electrode plate 1 covers track GND to form a capacitor therewith. Thus, at the end of step 3C, the entire structure is covered with an insulator except at the level of opening 21 and of electrode plate 1.

Figure 3D:
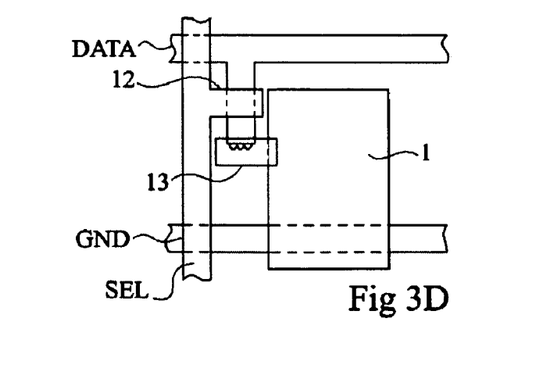

At the next step, illustrated in FIG. 3D, a third conductive layer, for example, aluminum, is deposited over the entire structure and this layer is etched to form, on the one hand, transistor-addressing line SEL comprising a portion 12 extending above the channel area of the MOS transistor and, on the other hand, a contact pad 13 putting in contact the drain end of the transistor and electrode plate 1.

The step sequence described in relation with FIGS. 3A and 3D has been described in simplified fashion to better show the fact that the structure according to the present invention can be manufactured with four masking steps only.

Embodiments of a MOS Transistor

Figure 4A:
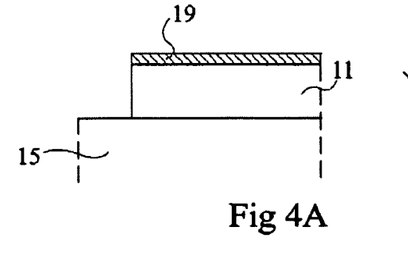
FIGS. 4A to 4D are cross-section views illustrating successive steps of the forming of a transistor according to an aspect of the present invention.
Figure 4B:
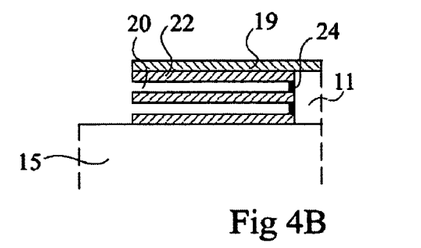
Figure 4C:
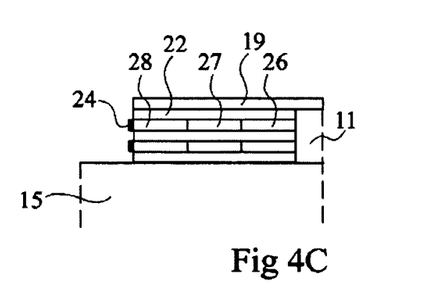
Figure 4D:
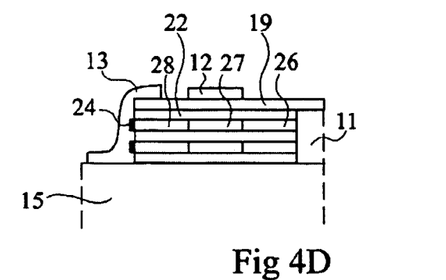

FIGS. 4A and 4D are cross-section views of successive steps of the manufacturing of a MOS transistor according to an aspect of the present invention.

As illustrated in FIG. 4A, the structure is formed on an insulating substrate, for example, a glass substrate 15 on which is formed an aluminum track for example corresponding to the outgrowth 11 illustrated in FIG. 3A. The structure is coated with an insulating layer 19, for example, a silica layer, which is etched to leave the end of outgrowth 11 apparent.

Then, various steps have been carried out, their result being illustrated in FIG. 4B. An anode oxidation of aluminum layer containing outgrowth 11 formed in conditions such as described by the applicants in French patent application 2860780. An advantage of this anode oxidation is that the apparent metal portions not submitted to an adequate voltage are not etched. These apparent layers are however preferably previously passivated. In this case, track GND, even if it was not covered with an insulating material, would not be etched (it will be seen that in some alternative embodiments of the invention, track GND may comprise apparent portions or that there may exist on the structure apparent metal portions not covered with silica). The anode oxidation transforms the end of outgrowth 11 into porous alumina 22 comprising essentially longitudinal pores 20, that is, pores parallel to the main plane of substrate 15. The pores thus obtained have, according to the oxidation conditions, diameters from 5 to 300 nm. It should be noted that the anode oxidation may be followed by an etching performed so that the bottom of the pores is in contact with aluminum comprising outgrowth 11 at the bottom of the etched area. Then, by an electrode position method, small catalyst pads 24, for example, made of gold, are formed at the bottom of the pores, in contact with the remaining aluminum surface. After this, fibers of a semiconductor material are grown by the so-called VLS method inside of pores 20. This growth may be performed in three phases to obtain fibers having their deepest portion 26 (in contact with aluminum 11) doped of a first conductivity type, having a second portion 27 which is not doped (practically, intrinsic, I), and having its third portion 28 doped of the same type as portion 26 again. An N-type doping may for example be obtained by growing the fibers from silane in the presence of phosphine; a NIN structure is then obtained. According to the VLS method, it should be noted that catalyst portion 24 (for example, gold) develops as the fibers grow and becomes apparent at the end of the pores.

According to an important feature of the present invention, a transistor is formed with no masking step other than the initial step comprising disengaging the end of outgrowth 11 before performing the various semiconductor fiber etch and growth processings. It should also be noted that the transistor channel and contact areas are altogether formed in the same deposition sequence.

A final step corresponding to the step previously described in relation with FIG. 3D has been shown in FIG. 4D, which comprises depositing a gate metal, defined by a portion of SEL line 12 above the central area of the fibers and an end contact 13 at the end of the fibers. This last contact will be particularly satisfactory due to the fact that this end is coated with a gold layer. Further, the contacts between the aluminum and the fibers on the one hand, the gold and the fibers on the other hand, is ohmic due to the fact that the end portions of the fibers have been heavily doped.

The possibility to grow fibers with the variable dopings results from the fact that these fibers grow in pores. Indeed, during the growth of the doped end portion 28, the doped material cannot deposit on the lateral walls of intrinsic portion 27 which is "shelled". Such an obtaining of a PIP or NIN structure (with I designating the intrinsic area) would not have been possible with fibers which have not grown in an encapsulation enclosure.

According to another advantage of the present invention, the doping of the fibers during their growth may be modified to have a lighter doping level at the limit between each doped region (drain or source) and the intrinsic region (channel). The equivalents of structures known as LDD (Low Drain Doping) are thus obtained, with advantages which are well known in the case of conventional MOS transistors. The doping of the doped regions may be varied between $10^{16}$ and some $10^{19}$ to obtain N or P and $N^+$ or $P^+$ regions.

FIGS. 5A to 5D illustrate a second embodiment of a transistor forming an aspect of the present invention.

As shown in FIG. 5A, it is started again from an outgrowth of a metal track 41 deposited on a substrate 15. This track portion exhibits an open end 42 and is further encapsulated by a protective layer 43, for example, silica. The track for example has a thickness on the order of from 100 to 500 nm and a width of a few μm, for example, from 2 to 5 μm.

Figure 5A:
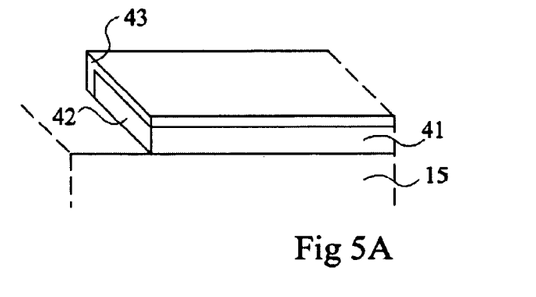
FIGS. 5A to 5D are cross-section views illustrating successive steps of the forming of a transistor according to another aspect of the present invention.
Figure 5B:
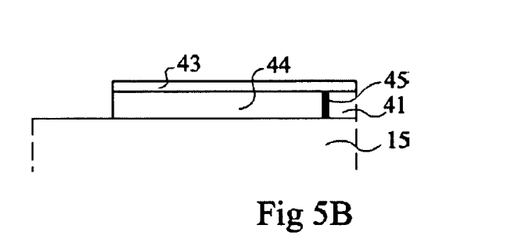

In this embodiment, as shown in FIG. 5B, metal track 41 is etched from end 42 to form a cavity 44 surrounded, except for its end, with protective layer 43. The inventors have shown that with such a structure, having dimensions with the above-indicated orders of magnitude, provided to deposit by electrodeposition at the bottom of the opening a catalyst 45, for example, gold, metal track 41 for example being molybdenum, nickel, or copper, a NIN or PIP transistor can be grown from the bottom of cavity 44 in the same way as nanofibers would be grown in the embodiment of FIG. 4C. This result is surprising since the techniques described in relation with FIGS. 4A to 4D essentially have been developed to form carbon nanotubes. For carbon nanotubes, it cannot be envisaged to increase the cavity dimensions. However, the inventors have shown that semiconductor areas could grow by the known VLS method in a cavity of much larger dimensions, such as those indicated hereabove.

Figure 5C:
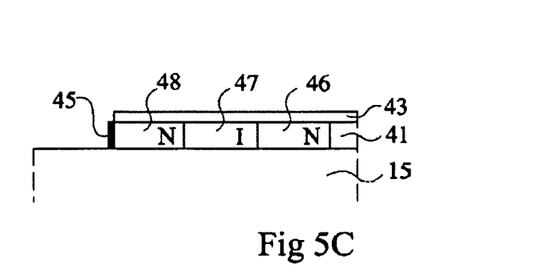

As shown in FIG. 5C, a transistor for example successively comprising a doped portion 46, for example, of type N, an undoped (intrinsic) portion 47, and a doped end portion 48 of the same conductivity type as portion 46 can successively be obtained.

Figure 5D:
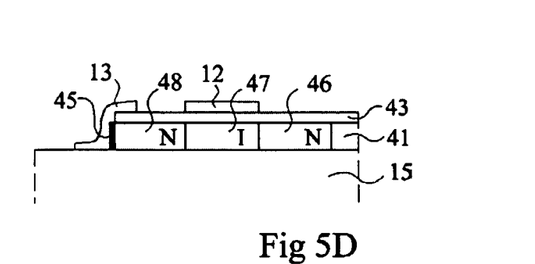

Then, as illustrated in FIG. 5D, as in the case of FIG. 4D, a metallization is deposited and etched to form a gate, defined by a portion of SEL line 12 and an end contact 13, end contact 13 for example forming a drain contact while metal track 41 forms a source contact of the transistor.

Various alternative embodiments are possible for the above-described transistors and their manufacturing modes. These alternative embodiments will occur to those skilled in the art. They may for example choose, once the transistor has been formed, to partially eliminate encapsulation layer 19 or 43 under gate 12 to have a thinner gate insulator. Techniques are known to obtain such a thinned region without requiring an additional mask, for example, by using above this portion of the silica layer a non-completely opaque mask, this mask being for example intended to define the etching of other layers.

Other Embodiments of an Active LCD Display Screen Plate Cell

As repeated several times in the present description, various alternative embodiments of the cells of an active flat display screen plate according to the present invention will occur to those skilled in the art. A few examples of such alternative embodiments will be indicated hereafter.

Figure 6:
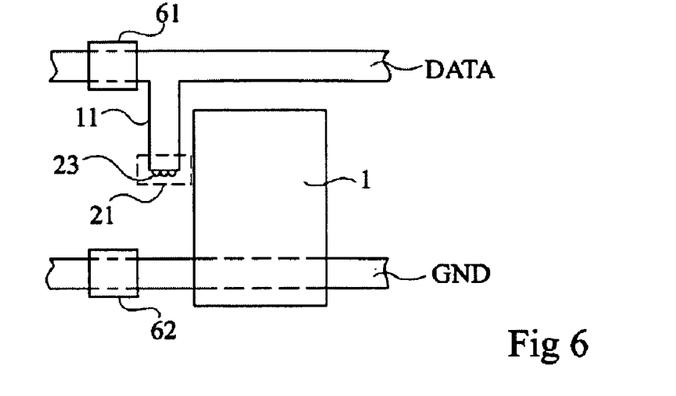
FIG. 6 is a top view illustrating a variation of a flat display screen cell manufacturing step according to the first embodiment of the present invention.

FIG. 6 shows a variation of the mask used in FIG. 3C. It should be reminded that in FIG. 3C, a conductive layer had been uniformly deposited, then etched, to delimit an electrode plate 1. It should also be reminded that at the previous step, the structure was uniformly coated with a silica layer except for the region of opening 21 delimited by a mask. According to the present variation of the invention, at the same time as electrode plate 1 is etched, portions 61 and 62 of the conductive layer are left in place at the locations where columns SEL must cross rows DATA and GND. Thus, portions 61 and 62 are arranged above lines DATA and GND with an interposed insulating silica. Then, using regions 1, 61, and 62 as masks, the silica can be etched to be completely eliminated or thinned down. At the next step, when the layer intended to form column SEL and its gate extension are deposited and etched, this gate extension may rest on an insulator layer, alumina, which is much thinner above the transistor channel area. However, a good insulation at the crossings between conductive lines is obtained due to the silica remaining in place under conductive layer portions 61 and 62. Due to this method, the thinning of the gate insulator may be performed without requiring any additional masking step.

Figure 7A:
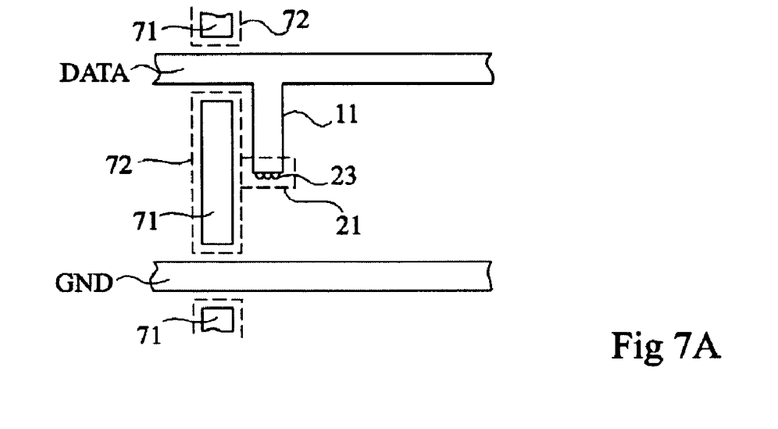
FIGS. 7A and 7B are top views illustrating successive steps of the manufacturing of a flat display screen cell according to a second embodiment of the present invention.
Figure 7B:
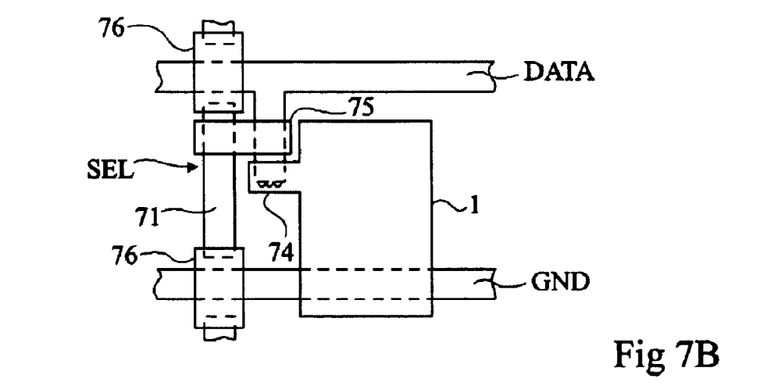

FIGS. 7A and 7B are views illustrating a second embodiment of the present invention.

As illustrated in FIG. 7A, in the first etching, corresponding to what is shown in FIG. 3A, at the same time as lines DATA and GND and outgrowths 11 of line DATA, metal portions 71 are left in place at the locations where the future line SEL must be located, except for the locations where this line crosses lines DATA and GND. Finally, by means of the mask used to define opening 21 (see FIG. 3B), regions 72 are disengaged from the surface of metal portions 71. A transistor is then formed in outgrowth 11 as described previously.

As illustrated in FIG. 7B, electrode plate 1, a contact 74 between this plate and the drain end of the transistors, a gate area 75, and conductive portions 76 forming a bridge above lines DATA and GND, intended to establish the connection between portions 71, are then formed by etching of a same conductive layer. It should be noted that in this embodiment, only two steps of deposition and etching of conductive layers instead of three are provided and that it is thus possible to form the pixel structure with three masking steps only.

Forming of an Active OLED Display Screen Plate Cell

Figure 8:
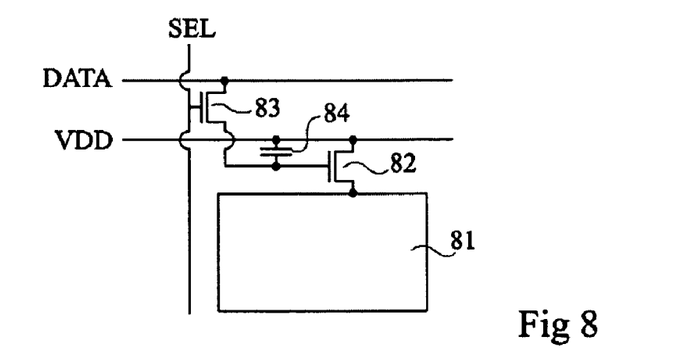
FIG. 8 partially shows in circuit form the outlook of a cell of the active plate of a flat matrix display screen such as an OLED screen.

FIG. 8 partially shows in the form of a circuit an example of a pixel of the active plate of an OLED-type display screen (OLED standing for Organic Light Emitting Diode). Each pixel comprises an electrode plate 81 that may be connected to a high voltage (VDD) via a switch 82, currently a MOS transistor, having its gate connected to a data line (DATA) via a switch 83, currently a MOS transistor. The gate of transistor 82 is also connected to the line at voltage VDD by a capacitor 84. The gate of transistor 83 is connected to a selection line (SEL). Electrode plate 81 is intended to form a first electrode of a diode having its other electrode formed above a layer of light-emitting organic material (see FIG. 9B).

Figure 9A:
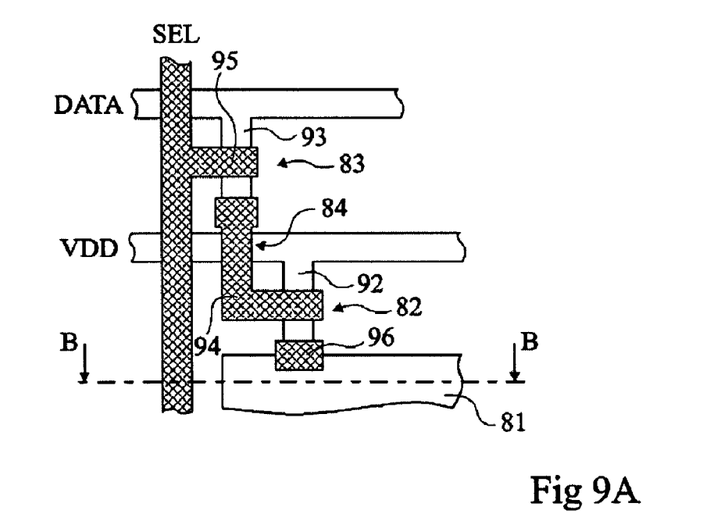
FIG. 9A is a top view of the active plate portion of an OLED-type flat display screen cell according to an embodiment of the present invention.

FIG. 9A is a top view of an embodiment of an active OLED-type flat display screen plate cell according to the present invention. This cell is formed in the crossing region of a data row DATA and of a row at a high voltage, VDD, with a selection column SEL, all three formed of conductive tracks. The electrode track is made in the form of a electrode plate 81, for example, made of a transparent conductive material such as ITO (indium and tin oxide). Transistor 82 is formed in an outgrowth 92 of line VOID. Transistor 83 is formed in an outgrowth 93 of line DATA. It should be understood that these transistors are formed in one of the previously-described ways. The gate of transistor 82 is formed of an end portion of a conductive section 94 having its other end connected to the drain of transistor 83. The gate of transistor 83 is formed of a portion 95 of selection line SEL extending above the median portion of outgrowth 93. A conductive pad 96 connects the end (drain or source) of transistor 82 to electrode plate 81. Capacitor 84 is formed of the superposed portion of conductive section 94 and of conductive line VDD, where the surface area of the crossing area can be adjusted to optimize the capacitance.

The way of forming OLED-type cells such as hereabove will be understood from the foregoing description of embodiments of LCD-type cells. Especially, the following sequence may be followed:

forming of lines DATA and VDD with outgrowths 93 and 92;

forming of MOS transistors 82 and 83 in outgrowths 92 and 93;

forming of electrode plate 81;

simultaneous forming of line SEL with its outgrowth 95, of line section 94, and of conductive pad 96.

Figure 9B:
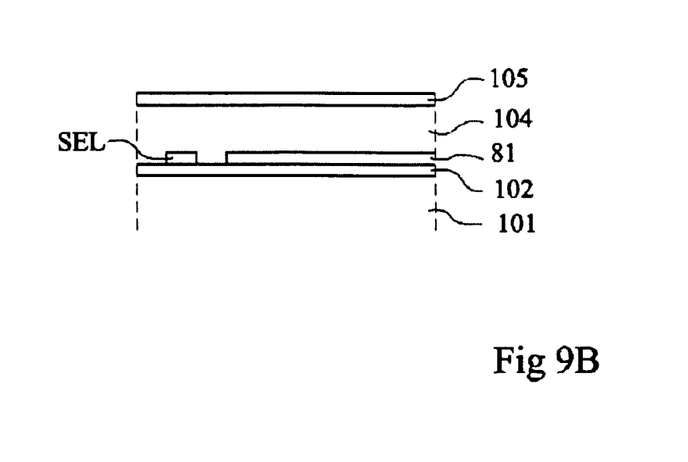
FIG. 9B is a simplified cross-section view of an OLED-type flat display screen portion comprising an active plate according to the present invention.

FIG. 9B is a simplified cross-section view along plane BB of FIG. 9A in which a portion of the support plate can be seen on the lower side, for example, a glass plate 101 possibly coated with a silica layer 102. On layer 102, a section of conductive line SEL and a section of electrode plate 81 are visible. Above electrode plate 81 are successively formed a layer of light-emitting organic material of selected color 104 and a conductive layer 105.

Variations

In the foregoing, the lower plate has been described as a transparent plate and electrodes 1 of an LCD cell or electrodes 81 of an OLED cell have been described as transparent. This corresponds to the case of a screen readable by transmission. It should be noted that there also exist screens readable by reflection. It is then no longer necessary for electrodes 1 or 81 to be made of a transparent material and this may simplify the manufacturing method. Especially, in certain cases, electrode 1 or 81 may then be formed at the same time as one of the metallizations used to form the structure rows or columns. A masking step is then spared.

It should be clear to those skilled in the art that various forms may be selected for the various metallizations and the various openings. Especially, the concept of horizontal rows and of vertical columns is purely arbitrary and other arrangements may be selected by those skilled in the art. Similarly, the shape of electrode plate 1 or 81 and the positioning of the transistors with respect to this plate will be selected according to the display panel designer's preferences.

The invention claimed is:

1. A method for manufacturing an active plate of a flat display screen comprising a matrix of cells, in which each cell of said matrix of cells comprises an electrode plate connected by a transistor to a first conductive line, said method comprising the steps of:
   providing, for each cell, an outgrowth coated with an insulator of said first conductive line;
   etching or making porous an end portion of said outgrowth;
   laterally growing a P-type-doped/intrinsic/P-type-doped (PIP) or N-type-doped/intrinsic/N-type-doped (NIN) semiconductor structure in the end portion which has been etched or made porous; and
   establishing a contact at a free end of the PIP or NIN semiconductor structure and forming a gate on a median portion of the PIP or NIN semiconductor structure.

2. The method of claim 1, wherein, for each cell, said first conductive line is made of aluminum which is made porous by anodic oxidation at the level of said outgrowth.

3. The method of claim 1, wherein, for each cell, said first conductive line is made of nickel or molybdenum which is partially eliminated under said insulator.

4. The method of claim 1, further comprising the steps of for each cell:
   (a) depositing and etching on a glass plate a first conductive layer to define said first conductive line comprising said outgrowth;
   (b) coating the semiconductor structure with a layer of an insulating material;
   (c) opening the end portion of said outgrowth and forming a transistor therein;
   (d) depositing and etching a second conductive layer to form said electrode plate; and
   (e) depositing and etching a third conductive layer to define a second conductive line, the second conductive line comprising portions covering channel area of the transistor, and to define a conductive region connecting said contact with said electrode plate.

5. The method of claim 4, wherein, in step (d) of depositing and etching a second conductive layer to form said electrode plate, conductive regions are defined above portions where said second conductive line crosses other lines deposited in said first conductive layer or metallizations of the PIP or NIN semiconductor structure.

6. The method of claim 4, further comprising the steps of:
   for each cell:
   defining in said first conductive layer said first conductive line comprising, said outgrowth and portions of a second conductive line at locations where said portions do not cross said first conductive line;
   disengaging the insulator from the end portion of the outgrowth and an upper surface from of said portions;
   forming said transistor in said outgrowth;
   depositing a second conductive layer, said second conductive layer being etched to form:
   said electrode plate,
   a gate region in contact with said portions, and
   regions interconnecting said portions at locations where said second conductive line crosses said first conductive line to ensure the continuity of said second conductive line.

7. The method of claim 1, wherein, for each cell, a portion of the electrode plate extends above a portion of a third conductive (GND) line, the GND line being an aluminum line and a dielectric being interposed between said electrode plate portion and the GND line.

8. The method of claim 1, wherein, for each cell, a second transistor is formed simultaneously with said semiconductor structure, from a second outgrowth coated with an insulator of another conductive line.

9. The method of claim 1, wherein the laterally growing is accomplished via a vapor-liquid-solid (VLS) method.

10. An active plate of a flat display screen, comprising a matrix of cells, wherein each cell of said matrix of cells comprises an electrode plate connected by a transistor to a first conductive line, said transistor being formed in an outgrowth of the first conductive line coated with an insulator.

* * * * *